US006998204B2

(12) United States Patent
Furukawa et al.

(10) Patent No.: US 6,998,204 B2
(45) Date of Patent: Feb. 14, 2006

(54) ALTERNATING PHASE MASK BUILT BY ADDITIVE FILM DEPOSITION

(75) Inventors: Toshiharu Furukawa, Essex Junction, VT (US); Mark C. Hakey, Fairfax, VT (US); Steven J. Holmes, Milton, VT (US); David V. Horak, Essex Junction, VT (US); Charles W. Koburger, III, Delmar, NY (US); Peter H. Mitchell, Jericho, VT (US); Larry A. Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 10/707,009

(22) Filed: Nov. 13, 2003

(65) Prior Publication Data

US 2005/0106472 A1    May 19, 2005

(51) Int. Cl.
*G01F 9/00*    (2006.01)
(52) U.S. Cl. ........................................... 430/5
(58) Field of Classification Search ............... 430/5; 216/22
See application file for complete search history.

(56) References Cited

U.S. PATENT DOCUMENTS

| | | |
|---|---|---|
| 4,468,420 A | 8/1984 | Kawahara et al. |
| 4,693,916 A | 9/1987 | Nagayama et al. |
| 4,770,901 A | 9/1988 | Katoh et al. |
| 4,882,183 A | 11/1989 | Ino et al. |
| 5,073,408 A | 12/1991 | Goda et al. |
| 5,114,760 A | 5/1992 | Takemura et al. |
| 5,132,140 A | 7/1992 | Goda et al. |
| 5,470,681 A * | 11/1995 | Brunner et al. ............ 430/5 |
| 5,536,603 A * | 7/1996 | Tsuchiya et al. ............ 430/5 |
| 5,614,270 A | 3/1997 | Yeh et al. |
| 5,648,128 A | 7/1997 | Yeh et al. |
| 5,661,051 A | 8/1997 | Yeh et al. |
| 5,900,337 A * | 5/1999 | Lee ............ 430/5 |
| 6,251,753 B1 | 6/2001 | Yeh et al. |
| 6,294,832 B1 | 9/2001 | Yeh et al. |

OTHER PUBLICATIONS

Homma et al., "A Selective SiO2 Film-Formation Technology Using Liquid-Phase Deposition for Fully Planarized Multilevel Interconnections", J. Electrochem. Cos., vol. 140, No. 8, 1993, pp. 2410-2414.

Ching-Fa Yeh, et al., "Comprehensive Investigation on Fluorosilicate Glass Prepared by Temperature-Difference-Based Liquid-Phase Deposition", J. Electrochem. Soc., vol. 147, No. 1, 2000, pp. 330-334.

Nagayama et al., "A New Process for Silica Coating", J. Electrochem. Soc., vol. 135, No. 8, 1988, pp. 2013-2016.

(Continued)

*Primary Examiner*—S. Rosasco
(74) *Attorney, Agent, or Firm*—Gibb I.P. Law Firm, LLC; Todd M.C. Li, Esq.

(57) ABSTRACT

The invention provides a method of forming a phase shift mask and the resulting phase shift mask. The method forms a non-transparent film on a transparent substrate and patterns an etch stop layer on the non-transparent film. The invention patterns the non-transparent film using the etch stop layer to expose areas of the transparent substrate. Next, the invention forms a mask on the non-transparent film to protect selected areas of the transparent substrate and forms a phase shift oxide on exposed areas of the transparent substrate. Subsequently, the mask is removed and the phase shift oxide is polished down to the etch stop layer, after which the etch stop layer is removed.

20 Claims, 4 Drawing Sheets

OTHER PUBLICATIONS

Homma et al., "Optical Properties of Fluorinated Silicon Oxide and Organic Spin-on-Glass Films for Thin-Film Optical Waveguides", J. Electrochem. Soc., vol. 147, No. 3, 2000, pp. 1141-1144.

Ching-Fa Yeh et al., "Novel Barrier Dielectric Liner Prepared by Liquid-Phase Deposition and NH3 Plasma Annealing", Journal of Appl. Phys. vol. 39, 2000, pp. 6672-6675.

* cited by examiner

ALTERNATING PHASE MASK BUILT BY ADDITIVE FILM DEPOSITION

BACKGROUND OF INVENTION

The present invention generally relates to phase shift masks and more particularly to an improved phase shift mask that uses liquid phase deposition oxide as a phase shift material.

As optical lithography is extended to images substantially smaller than the exposure wavelength, the use of resolution enhancement techniques is needed, such as altering (alternating) phase shift. The fabrication of altering phase shift masks is limited by the uniformity capabilities of the etch processes that define the phase shift regions. The etch processes do not have an etch stop layer, so the inherent pattern factor and across substrate variations in the RIE chamber are replicated in the substrate. This variation in etch depth causes a small focus window and an effectively reduced resolution. The invention described below addresses these issues.

SUMMARY OF INVENTION

The invention provides a method of forming a phase shift mask and (duplicate) phase shift mask. The method forms a non-transparent (e.g., absorptive, reflective) film on a transparent substrate and patterns an etch stop layer on the non-transparent film. The invention patterns the non-transparent film using the etch stop layer to expose areas of the transparent substrate. Next, the invention forms a mask on the non-transparent film to protect selected areas of the transparent substrate and forms a phase shift oxide on exposed areas of the transparent substrate. Subsequently, the mask is removed and the phase shift oxide is polished down to the etch stop layer, after which the etch stop layer is removed. More specifically, the phase shift oxide is formed by placing the transparent substrate and the non-transparent film within a deposition bath.

The polishing process and the thickness of the etch stop layer control the thickness of the phase shift oxide. Further, the process of forming the phase shift oxide is controlled to adjust the optical properties of the phase shift oxide.

The process of patterning the etch stop layer comprises forming an organic base layer on the non-transparent film, forming a nitride etch stop layer on the base layer, and forming a photoresist on the nitride etch stop layer. The invention exposes and develops the photoresist and then etches the nitride etch stop layer and the organic base layer through the resist layer. Openings in the mask are formed above openings within the non-transparent film to allow selected areas of the transparent substrate (where the phase shift oxide is to be formed) to be exposed.

In an alternative embodiment, the invention avoids the need to perform the polishing process by patterning a non-transparent film on a transparent substrate to expose areas of the transparent substrate, forming a mask on the non-transparent film to protect selected areas of the transparent substrate, forming a phase shift oxide on exposed areas of the transparent substrate, and removing the mask.

The foregoing processes produce a phase shift mask that comprises a transparent substrate, a patterned non-transparent film above the transparent substrate, and a liquid phase deposition oxide phase shift material within selected openings of the patterned non-transparent film.

The invention provides a number of advantages when compared to conventional structures and methods. For example, the invention utilizes an etch stop layer which eliminates the variations in the thicknesses of the phase shifters. Similarly, in the second embodiment, the thickness of the phase shifter is uniform across the wafer because of the liquid phase deposition process grows the oxide to uniform thicknesses. In addition, by utilizing the mask that includes the etch stop layer, a separate etch stop layer does not need to be formed.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
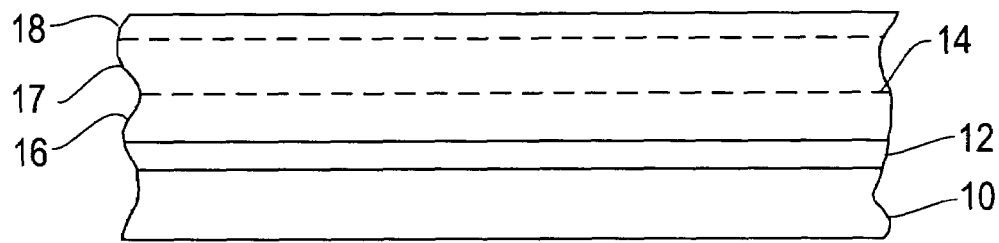
FIG. 1 is a schematic diagram of a partially completed phase shift mask.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 6:
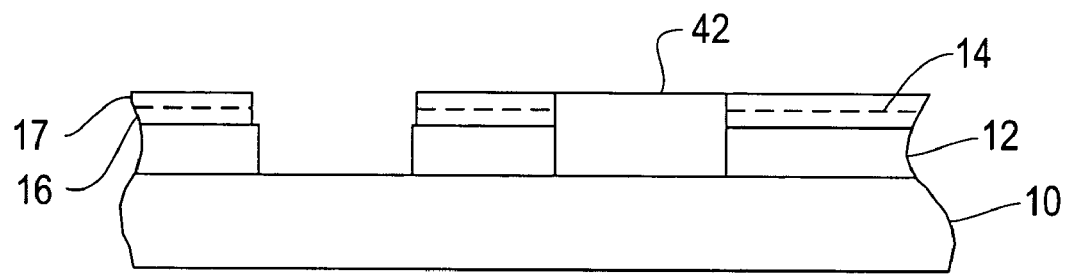
FIG. 6 is a schematic diagram of a partially completed phase shift mask.
Figure 7:
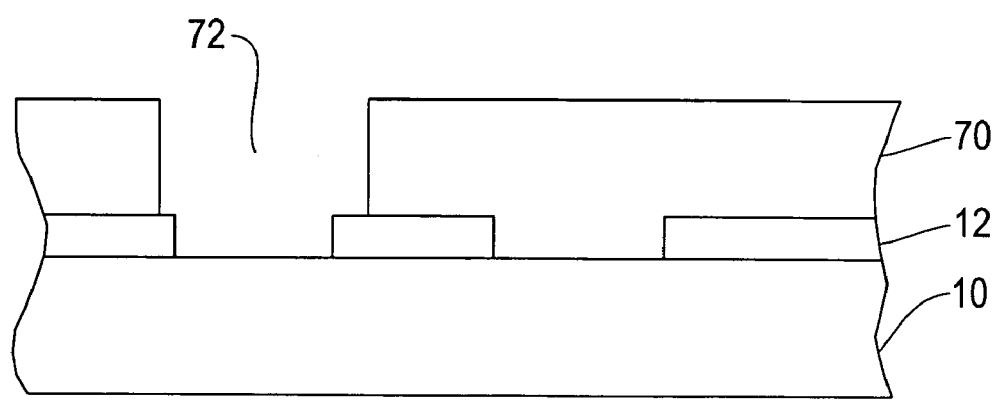
FIG. 7 is a schematic diagram of a partially completed phase shift mask.
Figure 8:
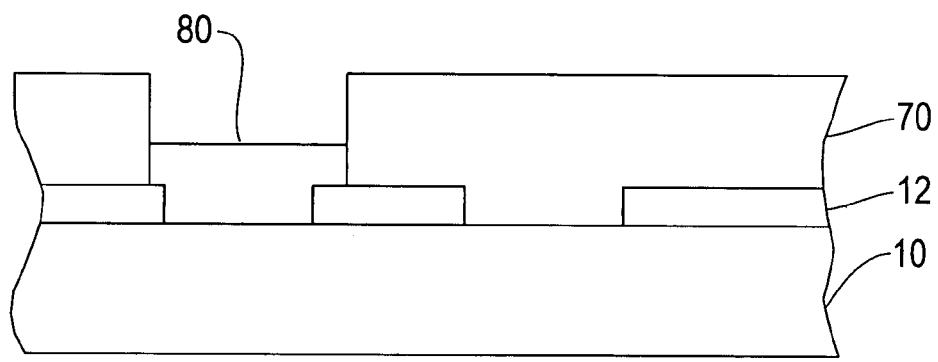
FIG. 8 is a schematic diagram of a partially completed phase shift mask.
Figure 9:
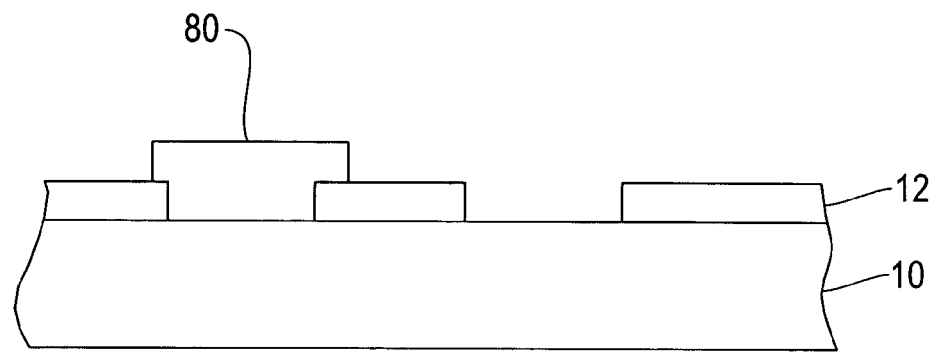
FIG. 9 is a schematic diagram of a partially completed phase shift mask.

The invention uses an additive film deposition (e.g., LPD) approach to forming the phase shifter, avoiding the problems of etch loading and pattern density. More specifically, the invention uses Liquid Phase Deposition (LPD) of oxide to form the phase shifters on the mask substrate. One embodiment of the invention is shown in FIGS. 1–6 and a second embodiment is shown in FIGS. 7–9.

As shown in FIG. 1, the invention begins with a standard mask blank with a reflective mask layer 12 (e.g., about 100–200 nm of chrome, tungsten, molybdenum, molybdynum silicide, etc.) over a transparent or semi-transparent substrate 10 (e.g., quartz, fluorinated quartz, $CaF_2$, hafnium oxide, etc.). Item 14 illustrates a resist film that is formed over the mask layer 12. The resist film 14 could comprise any appropriate resist. For example, the resist film 14 could comprise a tri-layer resist, with a hard-baked organic underlayer 16, silicon nitride polish stop layer 17, and E beam resist layer 18. The thickness of the hard baked underlayer 16 and the nitride polish stop 17 should be equal to the desired thickness of the phase shift material that is formed later.

Figure 2:
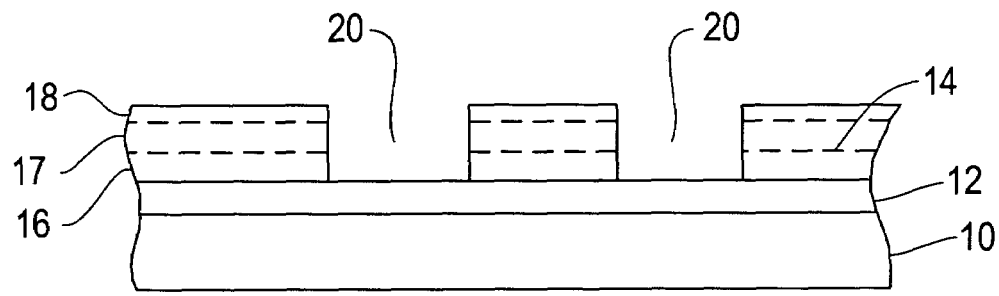
FIG. 2 is a schematic diagram of a partially completed phase shift mask.

As shown in FIG. 2, a mask pattern is exposed in the E beam resist 18, which is then developed. Next, the nitride polish stop 17 and hard baked organic layer 16 are etched in, for example, an oxygen reactive ion etching (RIE) process. This patterning and etching process creates patterned openings 20 in the resist film 14.

Figure 3:
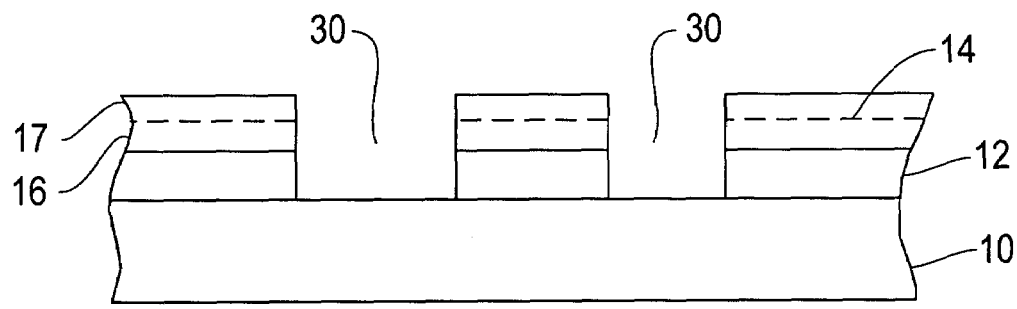
FIG. 3 is a schematic diagram of a partially completed phase shift mask.

As shown in FIG. 3, the chrome 12 is then etched using the resist 14 as a mask to create openings 30. After the chrome etch, the initial E beam resist layer 17 is removed, leaving the nitride polish stop 17 as the surface film of the resist 14.

Figure 4:
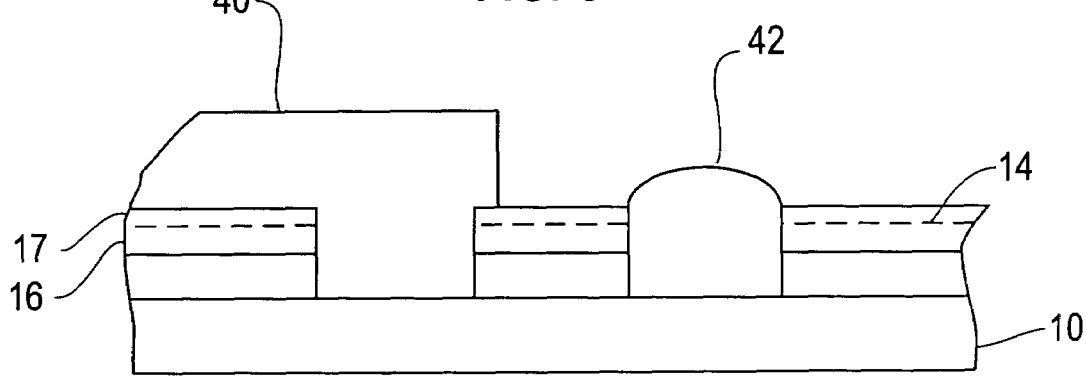
FIG. 4 is a schematic diagram of a partially completed phase shift mask.

Then, as shown in FIG. 4, another patterned mask 40 is formed to protect openings 30 in which the phase shift material is to not be formed. Mask 40 is an alternating mask, where every other opening 30 is protected, (usually, but not always, it may depend on the distance between adjacent features and the specific pattern layout of an array of semiconductor devices).

Next, a liquid-phase silicon dioxide 42 is grown onto the exposed quartz surface 10 through the unprotected ones of openings 30 by placing the structure in a deposition bath. The LPD oxide 42 will selectively grow on the quartz, not on the resist 40 or nitride hard mask 17.

More specifically, the patterned mask shown in FIG. 4 is immersed in an aqueous solution of $SiF_6$, which has reached supersaturation, either by warming from 0 C to 15–35 C, or by adding $H_2BO_3$, or by adding chips of aluminum metal. The boric acid and aluminum function by withdrawing fluorine from the system, causing supersaturation of $SiF_6$, and pushing the chemical equilibrium towards the formation silicon oxide. The silicon oxide deposits selectively on the exposed quartz surface of the mask, not on the resist or silicon nitride. The oxide growth occurs typically at 10–40 nm per minute. The deposition is continued until a small excess, 2–10%, of oxide is formed relative to the Cr/silicon nitride mask thickness. The refractive index of the LPD oxide 42 can be matched to the mask blank, if desired, by controlling the growth temperature of the liquid solution. The refractive index can be varied between 1.433 and 1.423 as the deposition temperature increases from 15 C to 35 C. The lower refractive index is usually associated with slightly less dense oxide. At 35 C they had deposition rates of about 100 nm/hour, as opposed to deposition rates of about 10 nm/hour at 15C. There is a slightly higher Fluorine content with the higher temperature deposition conditions, and also more hydroxyl functionality at the higher deposition temperatures (J. Electrochem, Soc. Vol. 147, pp. 330–334, 2000).

Figure 5:
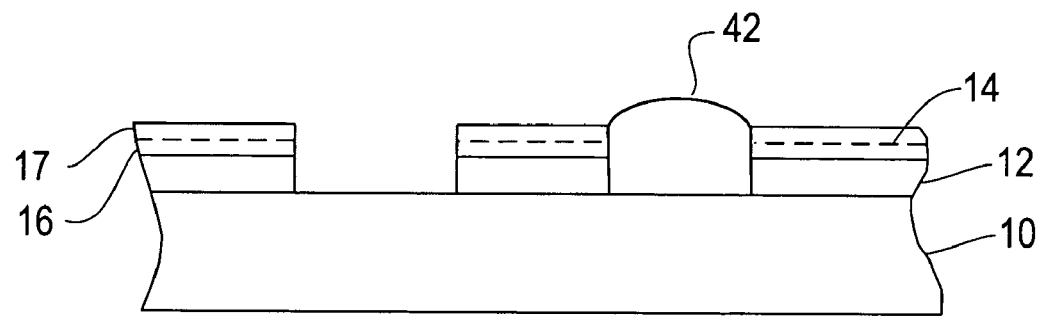
FIG. 5 is a schematic diagram of a partially completed phase shift mask.

After the structure is removed from the deposition bath, the mask 40 is removed, as shown in FIG. 5. In FIG. 6, a chemical-mechanical polishing process is used to trim back the film thickness of the LPD oxide 42 to the nitride polish stop surface 17. Thus, the thickness of the LPD oxide 12 is determined by the initial organic layer/nitride etch stop 16, 17 film stack thickness, less any nitride thickness consumed in the CMP process. In one example, the shifter thickness is usually about 150 nm for 193 nm lithography.

Thus, the process shown above uses CMP to attain a uniform thickness phase shifter. In this process the invention uses a selective deposition of silicon oxide on a patterned mask substrate in order to additively deposit a uniform layer of phase shifter material (fluorinated silicon oxide) in the desired regions of the lithography mask. A chemical mechanical polish step (CMP) is used to provide some enhancement to the shifter thickness uniformity, as well as provide a flat optical surface to the shifter. The alternating PSM mask is now complete, and ready for cleaning and pellicle mounting. There are no substantial differences of the LPD oxide verses conventional phase shifters, as they are both silicon oxide in nature.

In the second embodiment (shown in FIGS. 7–9) the CMP process is avoided and the oxide shifter thickness is determined only by the uniformity of the LPD process. This is a surface limited deposition and provides good uniformity across the substrate. The process is also selective, in that it only grows on quartz surfaces, not the resist.

The process begins with the patterned chrome structure formed to the point shown in FIG. 3. However, instead of the three-layer mask 14 utilized in the first embodiment, any conventional mask (such as a single layer mask) can be utilized to pattern the chrome 12. As shown in FIG. 7, the mask 14 is removed and a second mask 70 is deposited and patterned to protect the openings 30 in which the LPD oxide phase shifter is not to be formed. Then, using the same processing discussed above, the structure shown (in) FIG. 7 is placed in a deposition bath to form the liquid-phase silicon dioxide 80 within the opening 72, as shown in FIG. 8. Next, as shown in FIG. 9, the resist 70 is removed. The thickness can be monitored and controlled with an optical endpoint detector, based on laser interferometry.

The second process is similar to that described above, except the CMP step is eliminated, and the invention relies entirely on the liquid phase deposition of oxide (LPD oxide) to establish the uniformity and thickness of the phase shift layer. Thus, when the oxide has grown to the desired thickness, the mask is removed from the bath, the resist is stripped, and the mask is ready for cleaning and pellicle mounting.

Figure 10:
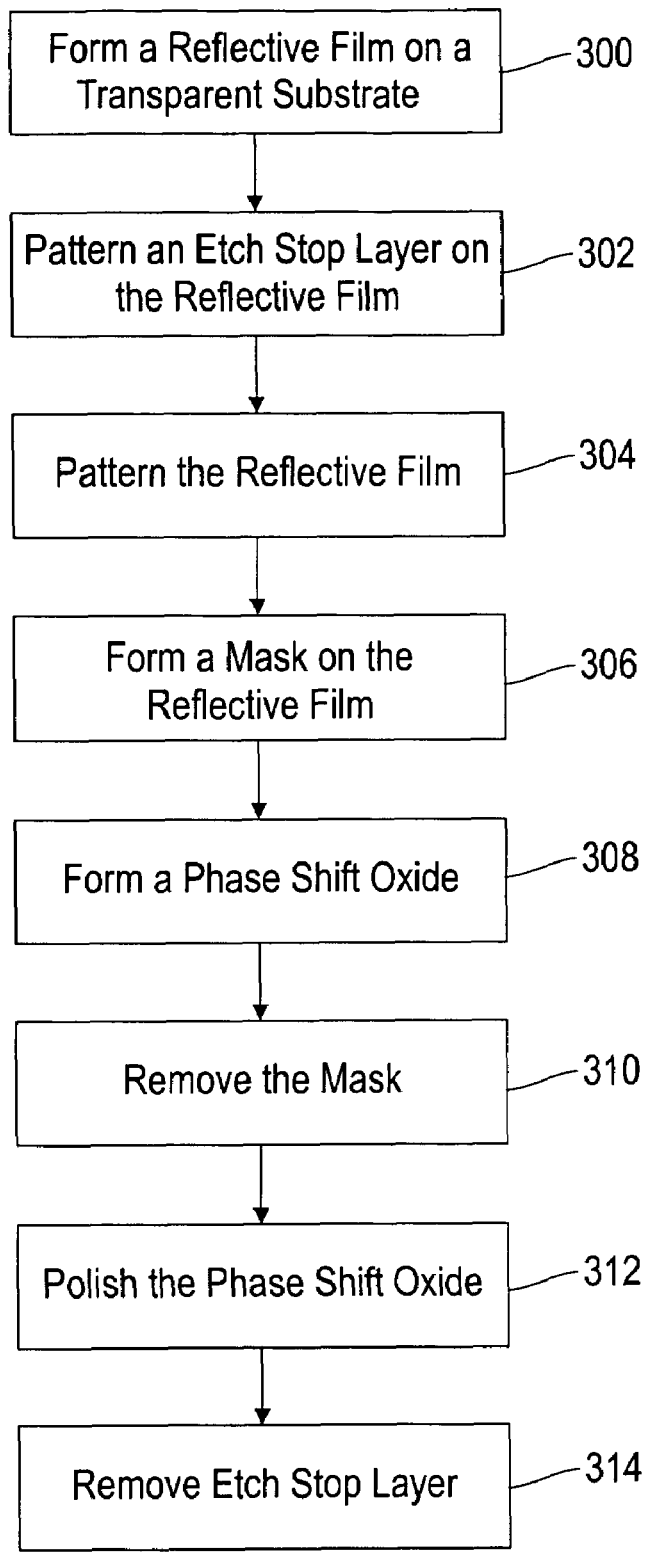
FIG. 10 is a flow diagram illustrating a preferred method of the invention.

As shown in the flowchart in FIG. 10, the invention provides a method of forming a phase shift mask. The method forms a non-transparent film on a transparent substrate 300 and patterns an etch stop layer on the non-transparent film 302. The invention patterns the non-transparent film 304 using the etch stop layer to expose areas of the transparent substrate. Next, the invention forms a mask on the non-transparent film 306 to protect selected areas of the transparent substrate and forms a phase shift oxide 308 on exposed areas of the transparent substrate. Subsequently, the mask is removed 310 and the phase shift oxide is polished 312 down to the etch stop layer, after which the etch stop layer is removed 314.

The invention provides a number of advantages when compared to conventional structures and methods. For example, the invention polishes using an etch stop layer which eliminates the variations in the thicknesses of the phase shifters. Similarly, in the second embodiment, the thickness of the phase shifter is uniform across the wafer because the liquid phase deposition process grows the oxide to a uniform thickness. In addition, by utilizing the mask that includes the etch stop layer, a separate etch stop layer does not need to be formed.

While the invention has been described in terms of preferred embodiments, those skilled in the art will recognize that the invention can be practiced with modification within the spirit and scope of the appended claims.

What is claimed is:

1. A method of forming a phase shift mask comprising:
forming a non-transparent film on a transparent substrate;
patterning an etch stop layer on said non-transparent film;
patterning said non-transparent film using said etch stop layer to expose areas of said transparent substrate;
forming a mask on said non-transparent film to protect selected areas of said transparent substrate;
forming a phase shift oxide on exposed areas of said transparent substrate;
removing said mask;
polishing said phase shift oxide down to said etch stop layer; and
removing said etch stop layer.

2. The method of claim 1, wherein said process of forming said phase shift oxide comprises placing said transparent substrate and said non-transparent film within a deposition bath.

3. The method of claim 1, wherein said polishing process controls the thickness of said phase shift oxide.

4. The method of claim 1, wherein the thickness of said etch stop layer controls the thickness of said phase shift oxide.

5. The method of claim 1, wherein said process of forming said phase shift oxide is controlled to adjust the optical properties of said phase shift oxide.

6. The method of claim 1, wherein said process of patterning said etch stop layer comprises:
forming an organic base layer on said non-transparent film;
forming a nitride etch stop layer on said base layer; and
forming a photoresist on said nitride etch stop layer.

7. The method of claim 6, wherein said process of patterning said etch stop layer further comprises:
exposing said photoresist;
developing said photoresist; and
etching said nitride etch stop layer and said organic base layer through said the resist layer.

8. The method of claim 1, wherein said process of forming said mask forms openings in said mask above openings within said non-transparent film to allow selected areas of transparent substrate where said phase shift oxide is to be formed to be exposed.

9. The method of claim 1, wherein said non-transparent film comprises one of chrome, tungsten, molybdenum, molybdynum silicide, and a chrome film.

10. The method of claim 1, wherein said transparent substrate comprises one of quartz, fluorinated quartz, CaF$_2$, hafnium oxide, and a quartz substrate.

11. A phase shift mask comprising:
a transparent substrate;
a patterned non-transparent film above said transparent substrate;
an etch stop layer above said patterned non-transparent film; and
a liquid phase deposition oxide phase shift material within selected openings of said patterned non-transparent film, wherein said phase shift material has a polished top surface above said patterned non-transparent film and comprises a predetermined thickness controlled by a thickness of said etch stop layer.

12. The mask of claim 11, wherein said non-transparent film comprises one of chrome, tungsten, molybdenum, molybdynum silicide, and a chrome film.

13. The mask of claim 11, wherein said transparent substrate comprises one of quartz, fluorinated quartz, CaF$_2$, hafnium oxide, and a quartz substrate.

14. A method of forming a phase shift mask comprising:
forming a non-transparent film on a transparent substrate, an organic layer on said non-transparent film, and an etch stop layer on said organic layer;
patterning said etch stop layer, said organic layer and said non-transparent film to expose areas of said transparent substrate;
forming a mask to protect selected areas of said transparent substrate;
forming a phase shift oxide on exposed areas of said transparent substrate;
removing said mask;
polishing said phase shift oxide down to said etch stop layer; and
removing said etch stop layer.

15. The method of claim 14, wherein said process of forming said phase shift oxide comprises placing said transparent substrate and said non-transparent film within a deposition bath.

16. The method of claim 14, wherein said polishing process controls the thickness of said phase shift oxide.

17. The method of claim 14, wherein the combined thickness of said etch stop layer and said organic layer controls the thickness of said phase shift oxide.

18. The method of claim 14, wherein said process of forming said phase shift oxide is controlled to adjust the optical properties of said phase shift oxide.

19. The method of claim 14, wherein said process of forming said mask forms openings in said mask above openings within said non-transparent film to allow selected areas of transparent substrate where said phase shift oxide is to be formed to be exposed.

20. The meted of claim 14, wherein said non-transparent film comprises one of chrome, tungsten, molybdenum, molybdynum silicide, and a chrome film.

* * * * *